(12) United States Patent
Rickman et al.

(10) Patent No.: US 9,240,673 B2
(45) Date of Patent: Jan. 19, 2016

(54) TUNABLE SOI LASER

(71) Applicant: Rockley Photonics Limited, Marlborough Wiltshire (GB)

(72) Inventors: Andrew Rickman, Marlborough (GB); Aaron John Zilkie, Pasadena, CA (US)

(73) Assignee: Rockley Photonics Limited, London (GB)

( * ) Notice: Subject to any disclaimer, the term of this patent is extended or adjusted under 35 U.S.C. 154(b) by 0 days.

(21) Appl. No.: 14/601,101

(22) Filed: Jan. 20, 2015

(65) Prior Publication Data

US 2015/0207296 A1    Jul. 23, 2015

(30) Foreign Application Priority Data

Jan. 20, 2014   (GB) .................................. 1400904.7

(51) Int. Cl.
| | |
|---|---|
| *H01S 3/10* | (2006.01) |
| *H01S 5/125* | (2006.01) |
| *H01S 5/14* | (2006.01) |
| *H01S 5/02* | (2006.01) |
| *H01S 5/10* | (2006.01) |

(Continued)

(52) U.S. Cl.
CPC .................. *H01S 5/125* (2013.01); *H01S 5/021* (2013.01); *H01S 5/1007* (2013.01); *H01S 5/142* (2013.01); *H01S 5/3031* (2013.01); *H01S 5/3224* (2013.01); *H01S 5/3427* (2013.01); *H01S 3/106* (2013.01); *H01S 3/1055* (2013.01); *H01S 5/028* (2013.01); *H01S 5/1209* (2013.01)

(58) Field of Classification Search
CPC ..... H01S 5/125; H01S 5/1007; H01S 5/3031; H01S 5/3224; H01S 5/3427; H01S 5/021
USPC .............. 372/12, 20, 29.023, 50.1, 50.11, 81, 372/102
See application file for complete search history.

(56) References Cited

U.S. PATENT DOCUMENTS

| | | | |
|---|---|---|---|
| 4,896,325 A | 1/1990 | Coldren | |
| 5,379,354 A | 1/1995 | Jenkins | |

(Continued)

FOREIGN PATENT DOCUMENTS

| | | |
|---|---|---|
| CN | 103457155 A | 12/2013 |
| EP | 1 761 103 A1 | 3/2007 |

(Continued)

OTHER PUBLICATIONS

English machine translation of Chinese Publication No. CN 103457155 A, dated Dec. 18, 2013, 10 pages.

(Continued)

*Primary Examiner* — Yuanda Zhang
(74) *Attorney, Agent, or Firm* — Christie, Parker & Hale, LLP

(57) ABSTRACT

A wavelength tunable silicon-on-insulator (SOI) laser comprising: a laser cavity including: a semiconductor gain medium having a front end and a back end; and a phase-tunable waveguide platform coupled to the front end of the semiconductor gain medium; wherein the phase-tunable waveguide platform includes a first Distributed Bragg Reflector (DBR) and a second Distributed Bragg Reflector (DBR); at least one of the Distributed Bragg Reflectors having a comb reflectance spectrum; and wherein a mirror of the laser cavity is located at the back end of the semiconductor gain medium.

29 Claims, 10 Drawing Sheets

(51) Int. Cl.
*H01S 5/30* (2006.01)
*H01S 5/32* (2006.01)
*H01S 5/34* (2006.01)
*H01S 3/1055* (2006.01)
*H01S 3/106* (2006.01)
*H01S 5/028* (2006.01)
*H01S 5/12* (2006.01)

(56) References Cited

U.S. PATENT DOCUMENTS

| | | | |
|---|---|---|---|
| 5,396,570 | A | 3/1995 | Jenkins et al. |
| 5,757,986 | A | 5/1998 | Crampton et al. |
| 5,987,050 | A | 11/1999 | Doerr et al. |
| 6,101,210 | A | 8/2000 | Bestwick et al. |
| 6,108,478 | A | 8/2000 | Harpin et al. |
| 6,298,177 | B1 | 10/2001 | House |
| 6,571,038 | B1 | 5/2003 | Joyner et al. |
| 6,728,279 | B1 | 4/2004 | Sarlet et al. |
| 6,768,827 | B2 | 7/2004 | Yoo |
| 6,873,763 | B2 | 3/2005 | Nikonov |
| 7,072,542 | B2 | 7/2006 | Jenkins et al. |
| 7,145,923 | B2 | 12/2006 | Carter et al. |
| 7,505,686 | B2 | 3/2009 | Jennen |
| 7,885,492 | B2 | 2/2011 | Welch et al. |
| 8,295,315 | B2 | 10/2012 | Ward et al. |
| 8,346,028 | B2 | 1/2013 | Feng et al. |
| 8,368,995 | B2 | 2/2013 | Dallesasse et al. |
| 8,559,470 | B2 | 10/2013 | Dallesasse et al. |
| 8,724,988 | B2 | 5/2014 | Andriolli et al. |
| 2002/0031297 | A1* | 3/2002 | Forrest et al. ............ 385/28 |
| 2003/0161570 | A1* | 8/2003 | Paniccia ............ 385/14 |
| 2004/0202440 | A1 | 10/2004 | Gothoskar et al. |
| 2009/0324173 | A1 | 12/2009 | Asghari |
| 2011/0085572 | A1* | 4/2011 | Dallesasse et al. ............ 372/20 |
| 2011/0206313 | A1 | 8/2011 | Dong et al. |
| 2012/0002694 | A1 | 1/2012 | Bowers et al. |
| 2012/0062900 | A1 | 3/2012 | Langley et al. |
| 2012/0250007 | A1 | 10/2012 | Na et al. |
| 2013/0235890 | A1* | 9/2013 | Creazzo et al. ............ 372/20 |
| 2014/0185980 | A1* | 7/2014 | Lei et al. ............ 385/14 |
| 2015/0207291 | A1 | 7/2015 | Rickman et al. |

FOREIGN PATENT DOCUMENTS

| | | |
|---|---|---|
| GB | 2 325 334 A | 11/1998 |
| WO | WO 2012/171557 A1 | 12/2012 |
| WO | WO 2013/145271 A1 | 10/2013 |

OTHER PUBLICATIONS

English machine translation of International Publication No. WO 2013/145271 A1, dated Oct. 3, 2013, 25 pages.
Farrington, Nathan et al., "A Demonstration of Ultra-Low-Latency Data Center Optical Circuit Switching", ACM SIGCOMM Computer Communication Review '12, Aug. 13-17, 2012, pp. 95-96, vol. 42, No. 4.
Fujioka, Nobuhide et al., "Compact and Low Power Consumption Hybrid Integrated Wavelength Tunable Laser Module Using Silicon Waveguide Resonators", Journal of Lightwave Technology, Nov. 1, 2010, pp. 3115-3120, vol. 28, No. 21.
International Search Report and Written Opinion of the International Searching Authority, Dated Apr. 1, 2015 and Mailed Apr. 21, 2015, Corresponding to PCT/GB2015/050104, 14 pages.
Jalali, Bahram et al., "Silicon Photonics", Journal of Lightwave Technology, Dec. 2006, pp. 4600-4615, vol. 24, No. 12.
Kachris, Christoforos et al., "A Survey on Optical Interconnects for Data Centers", IEEE Communications Surveys & Tutorials, Fourth Quarter 2012, pp. 1021-1036, vol. 14, No. 4.
Ngo, Hung Q. et al., "Constructions and Analyses of Nonblocking WDM Switches Based on Arrayed Waveguide Grating and Limited Wavelength Conversion", IEEE/ACM Transactions on Networking, Feb. 2006, pp. 205-217, vol. 14, No. 1.
Proietti, Roberto et al., "40 Gb/s 8×8 Low-latency Optical Switch for Data Centers", OSA/OFC/NFOEC, 2011, 3 pages.
Proietti, Roberto et al., "TONAK: A Distributed Low-latency and Scalable Optical Switch Architecture", 39th European Conference and Exhibition on Optical Communication (ECOC), 2013, pp. 1005-1007.
Solehmainen, K. et al., "Development of multi-step processing in silicon-on-insulator for optical waveguide applications", Journal of Optics A: Pure and Applied Optics, Jun. 7, 2006, pp. S455-S460, vol. 8.
Tanaka, Shinsuke et al., "High-output-power, single-wavelength silicon hybrid laser using precise flip-chip bonding technology", Optics Express, Dec. 4, 2012, pp. 28057-28069, vol. 20, No. 27.
Tsao, Shyh-Lin et al., "A Novel MMI-MI SOI Temperature Sensor", IEEE 13th Annual Meeting Lasers and Electro-Optics Society 2000 Annual Meeting, LEOS 2000, 2000, pp. 464-465, vol. 2.
U.K. Intellectual Property Office Search Report, Dated May 23, 2014, Received May 27, 2014, for Patent Application No. GB1400904.7, 4 pages.
U.K. Intellectual Property Office Search Report, Dated Jul. 16, 2014, Received Jul. 18, 2014, for Patent Application No. GB1400904.7, 3 pages.
Website: "TL5300 Series LambdaFLEX Micro-iTLA Tunable Laser", Oclaro, Inc., http://www.oclaro.com/product/tl5300-series/, printed Nov. 3, 2015, 3 pages.
Ye, Tong et al., "A Study of Modular AWGs for Large-Scale Optical Switching Systems", Journal of Lightwave Technology, Jul. 1, 2012, pp. 2125-2133, vol. 30, No. 13.
Ye, Tong et al., "AWG-Based Non-Blocking Clos Networks", IEEE/ACM Transactions on Networking, Apr. 2015, pp. 491-504, vol. 23, No. 2.
Zilkie, A.J. et al., "Power-efficient III-V/Silicon external cavity DBR lasers", Optics Express, Sep. 27, 2012, pp. 23456-23462, vol. 20, No. 21.
Smith et al., "Fundamentals of Silicon Photonic Devices," 7 pages, 2006.
Xi et al., "Petabit Optical Switch for Data Center Networks," Technical Report, Polytechnic Institute of NYU, 9 pages, 2010.

* cited by examiner

TUNABLE SOI LASER

FIELD OF THE INVENTION

The present invention relates to a wavelength tunable silicon-on-insulator (SOI) laser, particularly to a wavelength tunable SOI laser having a semiconductor gain medium with a front and a back end and a mirror of the laser cavity located at the back end of the semiconductor gain medium.

BACKGROUND OF THE INVENTION

Tunable semiconductor lasers are often used for applications in which an occasional but precise tuning of wavelength is required. They provide excellent wavelength stability and are typically manufactured as monolithic photonic integrated circuits in a gain medium such as a III-V semiconductor material. However, they are expensive to manufacture as a result of the need for multiple epitaxial re-growth steps. To date, demonstrations have been relatively slow to tune so, at present are only suitable for applications in which the speed of tuning is not a key factor.

Particularly in applications where the precise wavelength of the laser is not so important, there is a need for tunable lasers with a wide tuning range (>30 nm) but with fast switching speeds (of less than 100 ns or even more preferably less than 10 ns). Furthermore, in applications involving high data speeds and high device packing density, power efficiency is critical for technology adoption.

Silicon-on-insulator (SOI) lasers have become increasingly popular since SOI provides a practical, power efficient and cost-effective platform for the construction and integration of optical devices. Of course, the major challenge for SOI photonic integrated platforms is the fact that silicon is not an optical gain medium and does not therefore form an ideal medium for photonic circuits incorporating lasers. A common technique is to introduce a piece of gain material such as III-V gain material (often referred to as a gain chip) to a SOI photonic integrated circuit. An example of such a laser can be found in U.S. Pat. No. 6,101,210. A tunable laser constructed on a SOI PIC is disclosed in U.S. Pat. No. 8,559,470

One drawback of such a design is the high optical power loss, particularly due to coupling between the waveguides formed from the silicon substrate and waveguides in any optical devices placed in, grown onto or otherwise incorporated into the platform.

Thus, there is also a need for a SOI laser with an improved power efficiency.

SUMMARY OF THE INVENTION

According to a first aspect of the present invention, there is provided a wavelength tunable silicon-on-insulator (SOI) laser comprising: a laser cavity including: a semiconductor gain medium having a front end and a back end; and a phase-tunable waveguide platform coupled to the front end of the semiconductor gain medium; wherein the phase-tunable waveguide platform includes a first Distributed Bragg Reflector (DBR) and a second Distributed Bragg Reflector (DBR); at least one of the Distributed Bragg Reflectors having a comb reflectance spectrum; and wherein a mirror of the laser cavity is located at the back end of the semiconductor gain medium.

In this way, there is only one gain medium-SOI waveguide interface (i.e. that located at the front end of the gain medium). As a result, the tunable laser of the present invention has an improved power efficiency because the optical losses associated with coupling between the semiconductor gain medium and the waveguide platform are significantly reduced. In addition, the manufacturing complexity is reduced as it is only necessary to align the front end of the gain medium during manufacturing, for example in a flip-chip process.

With a mirror located at a back facet of the gain medium only one end (the front mirror) of the laser cavity is within the waveguide platform such that the gain medium functions as a Reflective Semiconductor Optical Amplifier (RSOA).

The Distributed Bragg Reflector having a comb reflectance spectrum should be understood to be a DBR with a comb-generating grating. Several comb-generating gratings are known to the skilled person. For example, the comb-generating grating may be a sectioned grating/sampled grating, phase-change grating, a binary superimposed grating DBR, or any other suitable grating known in the art.

The laser cavity is made up of the semiconductor gain medium and the SOI phase-tunable waveguide platform.

Throughout the application, references to "light" should be understood to include electromagnetic radiation of infrared and ultraviolet wavelengths as well as the visible spectrum. The range in output wavelengths of the laser will depend on the semiconductor gain medium used which may fall within the range of 0.4-20 μm. Taking into account the SOI platform, a typical wavelength range of a tunable SOI laser is 1.1-1.7 μm.

Optional features of the invention will now be set out. These are applicable singly or in any combination with any aspect of the invention.

Preferably, said mirror has a reflectivity of at least 85% and even more preferably, the mirror has a reflectivity of at least 90%.

Preferably, the Distributed Bragg Reflector having a comb reflectance spectrum is a Sectioned Grating Distributed Bragg Reflector (SG-DBR).

Preferably, at least one of the first Distributed Bragg Reflector and the second Distributed Bragg Reflector is a phase-tunable Distributed Bragg Reflector. Even more preferably, both the first DBR and the second DBRs are phase-tunable DBRs The phase-tunable Distributed Bragg Reflector preferably includes a phase tuning region the carrier density of which can be manipulated by application of a current or voltage bias. This may be a forward bias or a reverse bias depending on the properties of the phase tuning region chosen. Adjusting the bias will in turn adjust the phase and position in frequency space of the reflectance and transmittance spectrum of that region.

The phase tuning region may be a portion of or all of the phase-tunable DBR.

The phase-tunable Distributed Bragg Reflector may include a phase tuning region which comprises an electro-optical medium. The electro-optical medium will give rise to an electro-optical effect when a bias is applied which in turn will adjust the phase of the reflectance/transmittance spectrum.

Optionally, the phase tuning medium includes a p-i-n junction.

The electro-optical medium may be made of a p-i-n junction in a SiGe bulk material. The use of a SiGe bulk material is less expensive and less complicated to fabricate than more complicated structures such as quantum well structures. In bulk material the electro-optical effect is the Franz-Keldysh (FK) effect in which case the phase of the reflectance spectrum or transmittance spectrum (depending on the type of DBR) may be adjusted by application of a reverse bias across the p-i-n junction. The reverse bias induces an electric field in the SiGe bulk material, which, according to the FK effect, changes the refractive index of the material and the DBR grating, thus adjusting the phase and position in frequency space of the reflectance and transmittance spectra of the grating.

This tuning mechanism does not introduce a tuning-dependent loss and, can generate modulation speeds of less than 1 ns. In addition, operating in reverse bias is advantageous because it requires lower power consumption.

Alternatively, the material in the phase tuning region may be a quantum well material. In this way, the electro-optical effect will be the Quantum Confined Stark Effect (QCSE). Again, the phase of the reflected spectrum may be adjusted by application of a reverse bias across the p-i-n junction and the material of the quantum well material may be SiGe. The use of a quantum well material can result in even faster modulation speeds, and lower power consumption.

SiGe can be incorporated into SOI waveguides using methods known to those skilled in the art, and embodiments of this invention can involve first incorporating SiGe bulk or QW material in the region designated for the DBR grating, having the SiGe composition or QW layers engineered to have the right band-edge absorption that gives the strongest index change with minimal absorption increase, then etching the DBR mirror corrugation and waveguide structure in the SiGe, and including p- and n-doped regions on either side of the waveguide similar to as described above for the Si waveguides to create a p-i-n junction.

Where the phase tuning region is doped such that it includes a p-i-n junction, the p-i-n junction provides an electrically tunable phase tuning region whereby the phase of the reflectance spectrum or transmittance spectrum of a DBR can be adjusted via the free-carrier plasma dispersion electro-optical effect by application of a forward or reverse bias. Using this effect to create the necessary wavelength tuning (of ~6 nm) also introduces losses. Therefore in this scheme the grating length of the comb generating grating (e.g. SG-DBR) must be kept short to minimize the losses for the high current injections, however short gratings require deeper corrugation etch depths to maintain the mirror reflectance, and wider pass-bands. For the shortest physically realizable grating lengths (~100 µm-500 µm), the losses introduced by the plasma dispersion effect can still degrade the power efficiency of the laser. The p- and n-doped regions are preferably positioned to address the trade-off between modulation speed and loss. A smaller distance between p- and n- type regions is better for higher speeds as long as loss is kept low. Preferably, the p-type region is at least 0.1 µm but no more than 15 µm from the waveguide centre line (the centre of the intrinsic region) and preferably the n-type region is at least 0.1 µm but no more than 15 µm from waveguide centre line, even more preferably for 40 Gb/s operation the n-type and p-type regions are at least 0.1 µm and no more than 0.5 µm from the waveguide centre line.

The p- and n-doped regions are preferably positioned as close to the waveguide ridge centre as possible (even overlapping the waveguide ridge edges) so as to maximize the tuning speed without introducing extra absorption loss due to overlap with the optical mode.

Optionally, the phase tuning region includes a p-n junction device. In this way, the p-n junction device provides an electrically tunable phase tuning region whereby the phase of the reflectance spectrum or transmittance spectrum of a DBR can be adjusted via carrier depletion by application of a varying reverse bias. The p-n junction may optionally be a $p^+$-p-n-$n^+$, or $p^{++}$-$p^+$p-n-$n^+$-$n^{++}$ structure.

Where the phase tuning region includes a p-n junction, the junction may be offset from a waveguide centre line. For example, it may be offset by up to 0.5 µm; even more preferably for 40 Gb/s or greater modulation speeds it may be offset by up to 0.2 µm.

Preferably, both of the first Distributed Bragg Reflector and the second Distributed Bragg Reflector are phase-tunable Distributed Bragg Reflectors. The phase tuning region of the first Distributed Bragg Reflector may include any one of: a p-n junction; p-i-n junction or another electro-optical medium; and the phase tuning region of the second Distributed Bragg Reflector may include any one of: a p-n junction, p-i-n junction, or a different electro-optical medium. The phase tuning region of the first Distributed Bragg Reflector may be the of the same type and/or structure as the phase tuning region of the second Distributed Bragg Reflector; alternatively the phase tuning region of the first Distributed Bragg Reflector may be of a different type and/or from the phase tuning region of the second Distributed Bragg Reflector.

Optionally, the first Distributed Bragg Reflector is a Sectioned Grating-Distributed Bragg reflector (SG-DBR); and the second Distributed Bragg Reflector is a Sectioned Grating-Distributed Bragg reflector (SG-DBR).

The phase-tunable waveguide platform may include bifurcated waveguides, each arm of the bifurcated waveguides comprising one Distributed Bragg Reflector. Preferably, each arm of the bifurcated waveguides is an SG-DBR and optionally the bifurcated waveguide platform may be a Y-branch waveguide platform.

The phase-tunable waveguide platform may include an MMI coupler which couples light to the bifurcated waveguides and which may be tunable. Alternative splitters/couplers include a directional coupler or an MZ coupler.

Optionally, the first Distributed Bragg Reflector is a Sectioned Grating-Distributed Bragg reflector (SG-DBR); and the second Distributed Bragg Reflector is a Digital Supermode-Distributed Bragg Reflector (DS-DBR). Where the DBRs are arranged in a series arrangement, the second DBR may be the DBR closest to the gain medium and the first DBR the one that is furthest away from the gain medium.

Preferably, the DS-DBR is a phase-tunable transmission DS-DBR with a curved transmittance spectrum which is preferably the inverse of the curved power gain spectrum of the semiconductor medium. This curved response of the transmission DS-DBR (TDS-DBR) may be hard-written into the grating response with a nonlinear chirped grating design, or tuned into electrodes of the TDS-DBR via a small non-linear pattern of bias currents applied to the electrodes.

The wavelength tunable laser may further comprise a phase tuning region which is separate from the first and second Distributed Bragg Reflectors (i.e. which does not form a part of the phase-tunable DBR). This phase tuning region preferably forms an additional phase tuning device for fine tuning the lasing frequency. The phase tuning device may include: a p-n junction, p-i-n junction or another electro-optical medium. Where a phase-tunable waveguide platform is bifurcated, there may be an additional phase tuning device in each arm of the platform.

Each additional phase tuning region present may include any one of: a p-n junction; p-i-n junction or another electro-optical medium. Each additional phase tuning region may be of the same type and/or structure as the phase tuning region of the first and/or second Distributed Bragg Reflector and/or any other additional phase tuning regions present. Alternatively the phase tuning region of an additional phase tuning region may be or a different type and/or structure to the phase tuning region of the first and second Distributed Bragg Reflectors and any other additional phase tuning regions present. Optionally, the waveguide ridge thickness of at least one of the Distributed Bragg Reflectors is the same as the waveguide ridge thickness of a contiguous waveguide of the waveguide platform.

Preferably, the silicon overlayer thickness of the waveguide platform is more than or equal to 1 μm and less than or equal to 4 μm. Even more preferably, the silicon overlayer thickness of the waveguide platform is more than or equal to 2.5 μm and less than or equal to 3.2 μm.

Preferably, the ridge width of one or more waveguides of the waveguide platform is more than or equal to 1 μm and preferably less than or equal to 4 μm. Even more preferably, the ridge width of one or more waveguides of the waveguide platform is more than or equal to 2.5 μm and less than or equal to 3.2 μm.

Said mirror located at the back end of the semiconductor gain medium may be a reflective back-facet of the semiconductor gain medium. The semiconductor gain medium may be a gain chip.

Optionally, the phase-tunable waveguide platform comprises at least one transition region at which a waveguide of a first height (i.e. first ridge height) is coupled to a waveguide of a second height (i.e. second ridge height); the second height being less than the first height. In this case, the first and second Distributed Bragg Reflectors are preferably located in a waveguide of a second height.

In this way, where a Distributed Bragg Reflector includes a phase tuning region, the speed of tuning is greater because the waveguide dimensions at this region are smaller. The second height waveguides are "high-speed high-confinement" waveguides. However, by using larger waveguide dimensions in regions of the waveguide where phase tuning is not taking place, the higher losses associated with smaller waveguides can be reduced.

Optionally, the phase-tunable waveguide platform comprises a transition region at which a waveguide of a first width (i.e. first ridge width) is coupled to a waveguide of a second width (i.e. second ridge width); the second width being less than the first width. In this case the first and second Distributed Bragg Reflectors are preferably located in a waveguide of said second width.

The transition region is preferably a region in which both the height and width of the waveguide platform changes.

The silicon overlayer thickness of the wavelength portion having a first height may be as much as 18 times the silicon overlayer thickness of the wavelength portion having a second height. Preferable values for the reduced "high-speed high-confinement" waveguide portion of the waveguide platform include a silicon overlayer thickness (T) of the waveguide platform which is is more than or equal to 0.2 μm and less than or equal to 3.5 μm (this contrasts with the "standard" values of more than or equal to 2.5 μm and less than or equal to 3.5 μm elsewhere in the waveguide platform). Even more preferably, the silicon overlayer thickness of the "high-speed high confinement" waveguide portion of the waveguide platform is more than or equal to 0.2 μm and less than or equal to 3.2 μm.

The second width may be as much as 14 times that of the first width. Preferable values for the reduced "high-speed high-confinement" waveguide portion of the waveguide platform include a ridge width (w) which is more than or equal to 0.3 μm and less than or equal to 1 μm (this contrasts with the "standard" values of more than or equal to 1 μm and less than or equal to 4 μm elsewhere in the waveguide platform). Even more preferably, the ridge width of one or more waveguides of the "high-speed high-confinement" waveguide portion of the waveguide platform is more than or equal to 0.45 μm and less than or equal to 0.9 μm.

Preferable values for the reduced "high-speed high-confinement" waveguide portion of the waveguide platform include a slab height (h) which is more than or equal to 0 μm and less than or equal to 0.4 μm (this contrasts with the "standard" values of more than or equal to 0 μm and less than or equal to 1.8 μm elsewhere in the waveguide platform). Even more preferably, the slab height of one or more waveguides of the "high-speed high-confinement" waveguide portion of the waveguide platform is more than or equal to 0.05 μm and less than or equal to 0.35 μm.

The transition region may include a taper. Where the transition region is a transition between two waveguides of different heights, the taper may include a vertical taper. As vertical slopes can be difficult to create on a waveguide platform, this taper may in fact take the form of a multilayer rib waveguide transition having three layers/portions with laterally tapered walls which has the effect of tapering to couple a waveguide of a larger height and width to a waveguide of a smaller height and width.

Where a transition region is a transition between two waveguides of different widths, the taper will include a horizontal taper. Where the transition region is a transition between two waveguides of different heights and widths, a taper will taper in both vertical and the horizontal dimensions.

Where a waveguide platform includes DBRs in a series arrangement, a transition is preferably located between the point at which the waveguide platform is coupled to the semiconductor gain medium and the point at which the closest Distributed Bragg Reflector is located.

In this way, the height (and/or width) of the waveguide is optimized for low loss and mode matching to the gain medium at a first height (and/or width) at the interface to the gain medium but the height (and/or width) is reduced so as to be optimized for speed and power efficiency at a second height (and/or width) at the portion of the waveguide platform where the Distributed Bragg Reflectors are located.

Where a waveguide platform is bifurcated, a transition is preferably located between the point at which the waveguide platform is coupled to the semiconductor gain medium and the point of the bifurcation. In this way, the height (and/or width) of the waveguide is optimized for low loss and mode matching to the gain medium at a first height (and/or width) in the gain medium but the height (and/or width) is reduced so as to be optimized for speed and power efficiency at a second height (and/or width) at each arm of the bifurcated waveguide platform where the Distributed Bragg Reflectors are located. Optionally, an additional transition region may be located at the output of the laser cavity such that the Distributed Bragg reflector which forms the output mirror is of a second (smaller) height (and/or width) and the laser output waveguide coupled to this is of a first (larger) height and/or width. The transition region may also be a mode transformer.

In tunable lasers, the tuning speed is dictated by two parameters, the modulation frequency of the laser cavity and the modulation speed of the phase tuner that is performing the wavelength tuning function. The phase tuner modulation speed can range from 10 ps to 100 ns as discussed above, depending on the physical tuning effect, and diode design, and waveguide dimension. If the phase tuner modulation is sufficiently fast, the laser cavity modulation frequency must also be maximized.

The modulation frequency is proportional to the inverse of the laser cavity lifetime so to maximize the modulation frequency the cavity photon lifetime must also be minimized.

In addition, for a tunable laser it is desirable to have the cavity mode spacing sufficiently wide to avoid a mode-hop when the local temperature of the laser changes dynamically by a few degrees Celsius during the tuning process, as well as to avoid multiple cavity modes capable of lasing simultaneously inside the Bragg grating pass-band. For these reasons it is desirable to have the mode spacing, or the free-spectral-range (FSR) of the laser cavity, to be more than 30 GHz, and even more preferably more than or equal to 40 GHz.

Preferably, the round trip path length of the laser cavity is therefore no more than 1.5 mm, even more preferably, no more than 1 mm.

According to a second aspect of the present invention, there is provided a wavelength tunable silicon-on-insulator (SOI) laser comprising: a laser cavity including: a semiconductor gain medium; and a phase-tunable waveguide platform coupled to the semiconductor gain medium; wherein the phase-tunable waveguide platform includes a first Distributed Bragg Reflector and a second Distributed Bragg Reflector; at least one of the Distributed Bragg Reflectors being a Sectioned Grating-Distributed Bragg Reflector (SG-DBR); and wherein the phase-tunable waveguide platform comprises at least one transition region at which a waveguide of a first height is coupled to a waveguide of a second height; the second height being less than the first height.

Further optional features of the invention are set out below.

BRIEF DESCRIPTION OF THE DRAWINGS

Embodiments of the invention will now be described by way of example with reference to the accompanying drawings in which.

DETAILED DESCRIPTION AND FURTHER OPTIONAL FEATURES OF THE INVENTION

Figure 1:
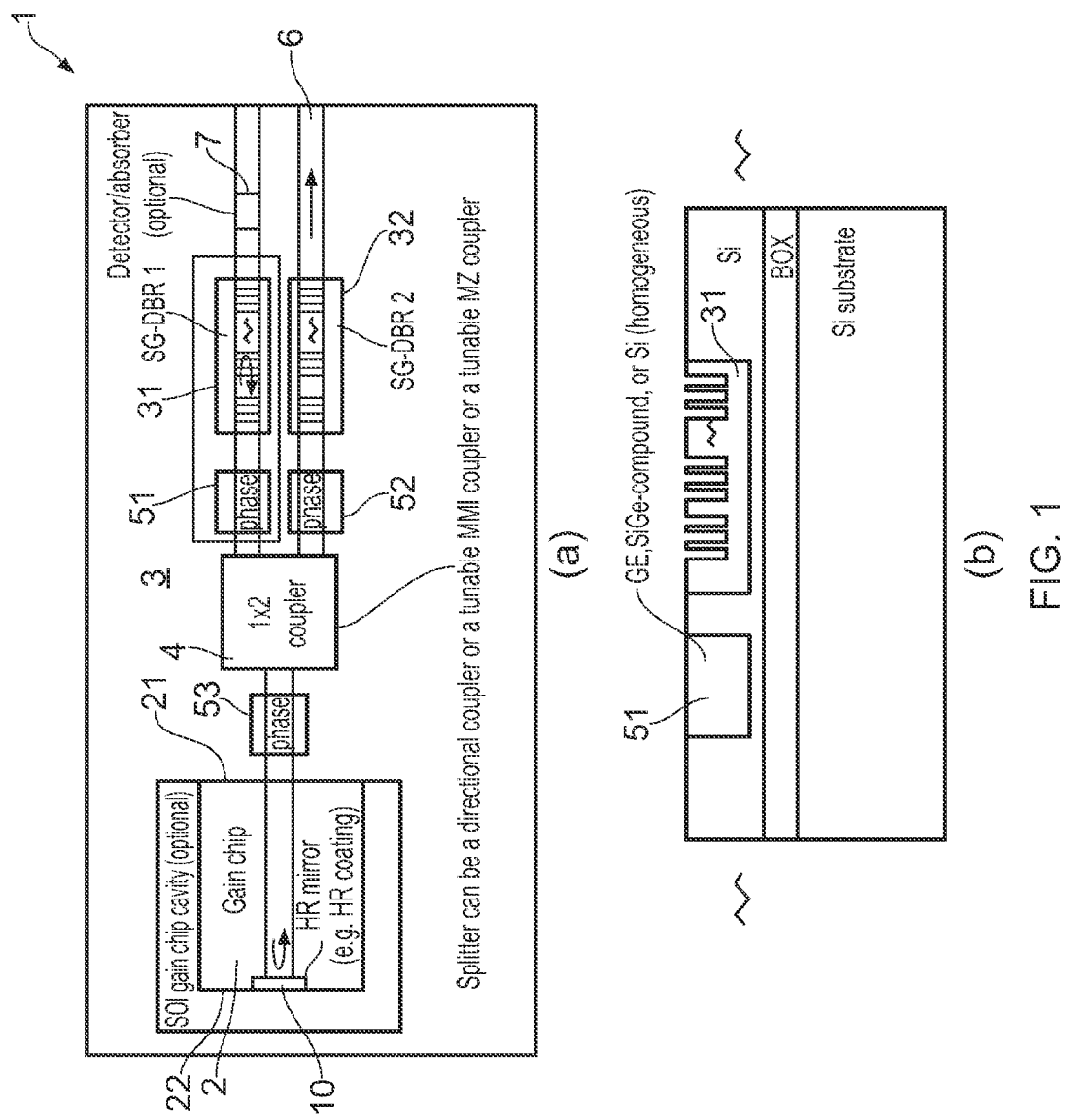
FIG. 1 shows a wavelength tunable silicon-on-insulator (SOI) laser according to a first embodiment of the present invention, where (a) is a top view schematic; (b) is a side view of the portion highlighted by the dotted box in (a); (c) is a top view of one example of the portion shown in (b) showing the detailed structure of a p-i-n phase-tunable region; (d) shows an alternative example of the highlighted portion also having a p-i-n tunable region; and (d) shows another alternative example of the highlighted portion, this time having a p-n tunable region (in this case, a $p^+$-p-n-$n^+$ structure)
Figure 1:
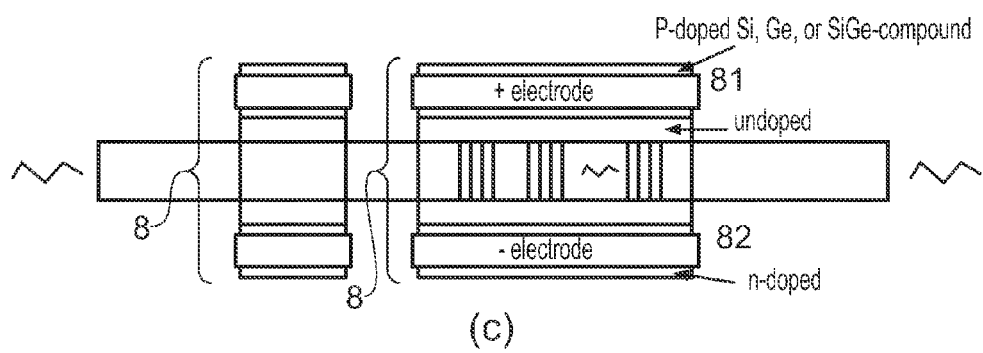
Figure 1:
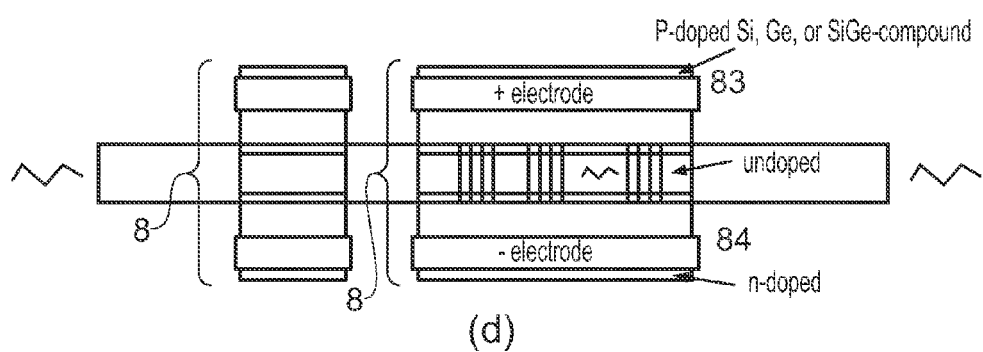
Figure 1:
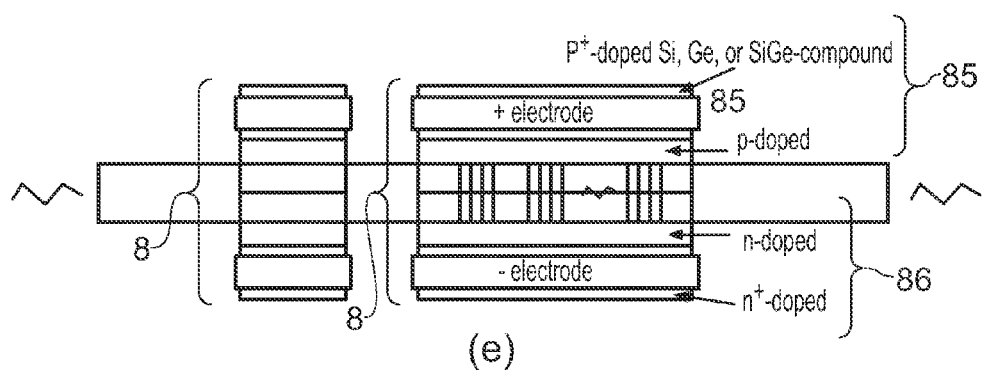
Figure 2:
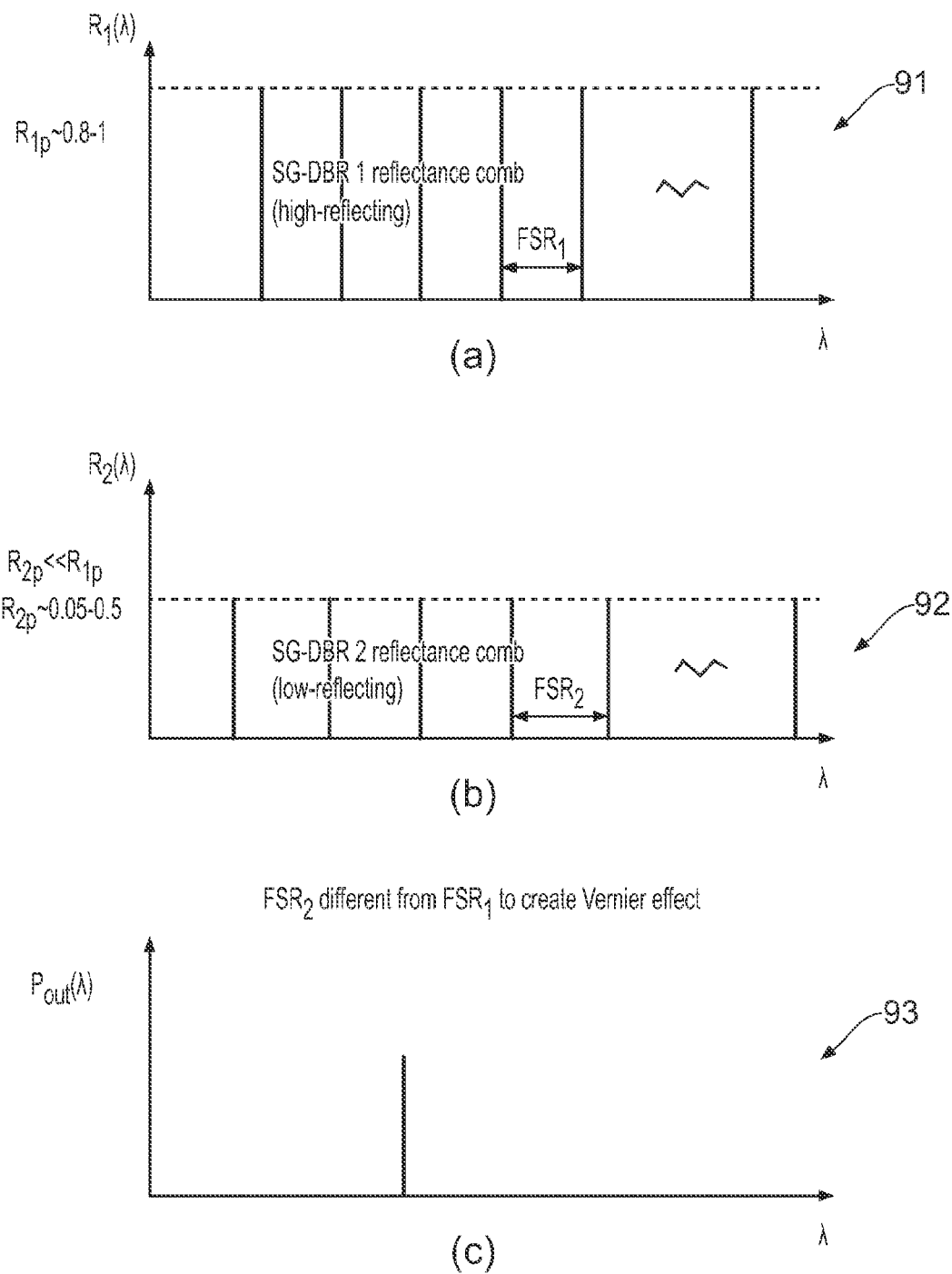
FIG. 2 shows an example of reflectance spectra of the DBR gratings and laser output spectrum for any one of the examples shown in FIG. 1 where (a) shows an example of the comb spectrum of the first DBR (in the top arm); (b) shows an example of the comb spectrum of the second DBR (in the bottom arm); and (c) shows the resulting output spectrum of the laser.

With reference to FIGS. 1 and 2, a first embodiment of a wavelength tunable silicon-on-insulator (SOI) laser, 1, 11, 12, 112 is shown, the laser comprising a laser cavity, made up of a semiconductor gain medium, 2 and a phase-tunable waveguide platform, 3 coupled to the gain medium.

The semiconductor gain medium has a front end, 21 and a back end, 22 and a mirror of the laser cavity is located at the back end. In the embodiment shown in FIG. 1, the semiconductor gain medium takes the form of a gain chip and the mirror, 10 at the back end of the cavity takes the form of a reflective surface (e.g. a dielectric coating) directly applied to the back end of the gain medium, in this case a reflective back facet of the gain chip. In the embodiment shown in FIG. 1 (a) the waveguide platform includes an SOI gain chip cavity for location of the gain chip.

The phase-tunable waveguide platform includes a first Distributed Bragg Reflector (DBR), 31 and a second Distributed Bragg Reflector (DBR), 32. In this embodiment, both the first and second DBRs have a comb reflectance spectrum as both are Sectioned Grating Distributed Bragg Reflectors (SG-DBRs). The waveguide platform is bifurcated with one SG-DBR in each arm.

The phase-tunable waveguide platform also includes a 1×2 coupler, 4 which couples light to the first and second arm of the bifurcated waveguides. This may be an MMI coupler, a directional coupler or an MZ (Mach-Zehnder) coupler and may be tunable. The first DBR is located in a first arm, and the second DBR is located in a second arm.

In addition, the phase-tunable waveguide platform also comprises a first additional phase tuning region, 51 located in the first arm and a second additional phase tuning region, 52 located in the second arm each of which are separate from the first and second DBRs and each of which enable fine tuning of the lasing frequency. A third additional phase tuning region, 53 may be located in-between the gain medium, 2 and the coupler, 4. The laser output, 6 is located at the front mirror (the DBR mirror itself) in the second arm of the waveguide platform. The first arm may include an optional detector or absorber, 7 past the DBR mirror.

Each DBR is a phase-tunable DBR so includes a phase tuning region 8. In FIGS. 1 (c) and (d), the phase tuning region is a p-i-n junction. In FIG. 1(c) p- and n-doped, 81, 82 regions are detached from the waveguide ridge defining an intrinsic region therebetween, encompassing the entire waveguide ridge width which leads to a lower speed, but also a lower loss, and is compatible with forward bias carrier injection phase tuning. In FIG. 1(d) the p- and n-doped regions, 83, 84 overlap the waveguide ridge using side-wall doping defining an intrinsic region occupying only a central portion of the waveguide ridge, which leads to a lower capacitance, higher speed, but higher loss and is only compatible with reverse bias carrier depletion phase tuning.

In FIG. 1(e), the phase tuning region is a p-n junction diode, and can take the form of a p-n diode, or a $p^+$-p-n-$n^+$ diode, or even $p^{++}$-$p^+$-p-n-$n^+$-$n^{++}$ diode, having $p^{++}$, $p^+$, $n^+$, and $n^{++}$ regions outside the waveguide ridge and p and n regions overlapping the waveguide and joining at the middle. In this case there is no intrinsic region, enabling reverse bias operation and the use of the carrier depletion effect. This example therefore gives a higher speed but may also result in a higher power consumption. In the embodiment shown, the p-n junction has a $p^+$-p-n-$n^+$ doping structure.

As shown in FIG. 1(b), the phase tunable DBRs, 31, 32 and the additional phase tuning regions, 51, 52, 53 comprise a material which could be a different material such as Ge or SiGe; or could be homogeneous Si (not shown). In the cases where the material in the phase tuning regions is different than Si, the gratings are etched into the different material.

In each of FIGS. 1 (c)-(e), the additional phase tuning regions have the same doping structure as the DBR. In an alternative embodiment (not shown), the doping structure of the additional phase tuning regions may be different to the doping structure of the phase-tunable DBR)

Each comb-generating DBR has a comb reflectance spectrum, 91, 92 as shown in FIGS. 2(a) and 2(b). The comb reflectance spectrum of the first DBR has a free spectral range (FSR) (a comb spacing) which is different from the FSR, $FSR_2$ of the second DBR. This means that wavelength tuning of the first embodiment is achieved using the Vernier effect by altering the reflected spectrum of one (or both) of the DBRs relative to the other (each other) so that a given mode of the first reflectance spectrum overlaps with a given mode of the second reflectance spectrum. The reflectance spectrum of the second SG-DBR is significantly lower than the reflectance spectrum of the first SG-DBR, the on-resonance reflectance of the first SG-DBR having a value within the range of 0.8-1 and the on-resonance reflectance of the second SG-DBR having a value within the range of 0.05-0.5.

The output spectrum, 93 of the laser will correspond to the sum of the two reflectance spectra which will therefore pick out the overlapped mode (shown as the third mode in FIG. 2).

Figure 3:
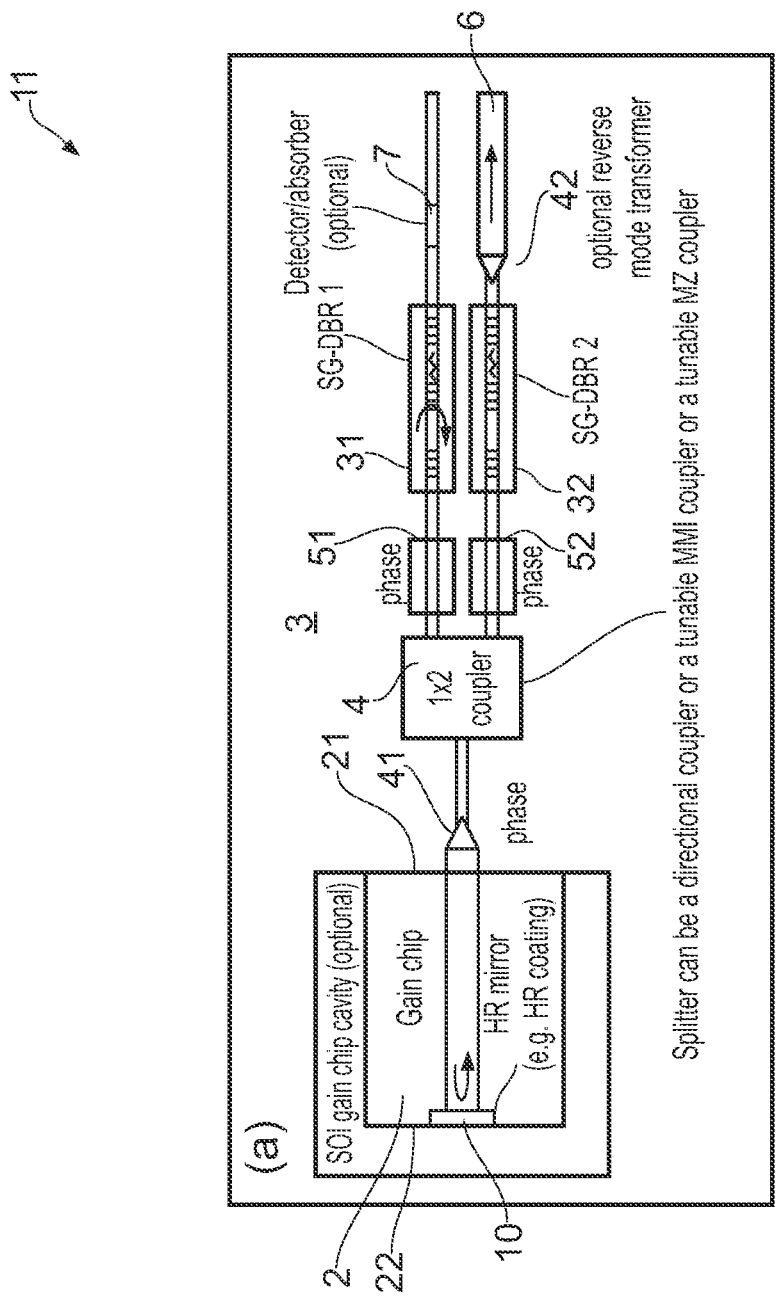
FIG. 3 shows a top-view schematic of a wavelength tunable silicon-on-insulator (SOI) laser according to a second embodiment of the present invention.

A second embodiment is described with reference to FIGS. 3 and 4, where like reference numerals correspond to those features described above in relation to FIGS. 1 and 2. The second embodiment differs from the first embodiment in that it includes a transition region, 41 located in-between the semiconductor gain medium and the 1×2 coupler at which a waveguide of a first height, $T_1$ and first width (first ridge width), $w_1$ is coupled to a waveguide of a second height, $T_2$ and a second width (second ridge width) $w_2$; the second height being less than the first height and the second width being less than the first width. In this case, the first and second Distributed Bragg Reflectors are each located in a waveguide of a second height, $T_2$ and second width $w_2$.

This embodiment with reduced waveguide dimensions can produce phase modulators with faster tuning speeds and lower power consumption, at the expense of adding the additional loss introduced by the mode transformer to the laser cavity.

A second transition region, 42 is located at the output of the laser cavity which forms a transition from the waveguide of the second height and width back to a waveguide having a first height and width.

As with the first embodiment, a third additional phase tuning device/region may be located between the gain medium and the 1×2 coupler. This may be located in-between the first transition region 41 and the 1×2 coupler.

Figure 4:
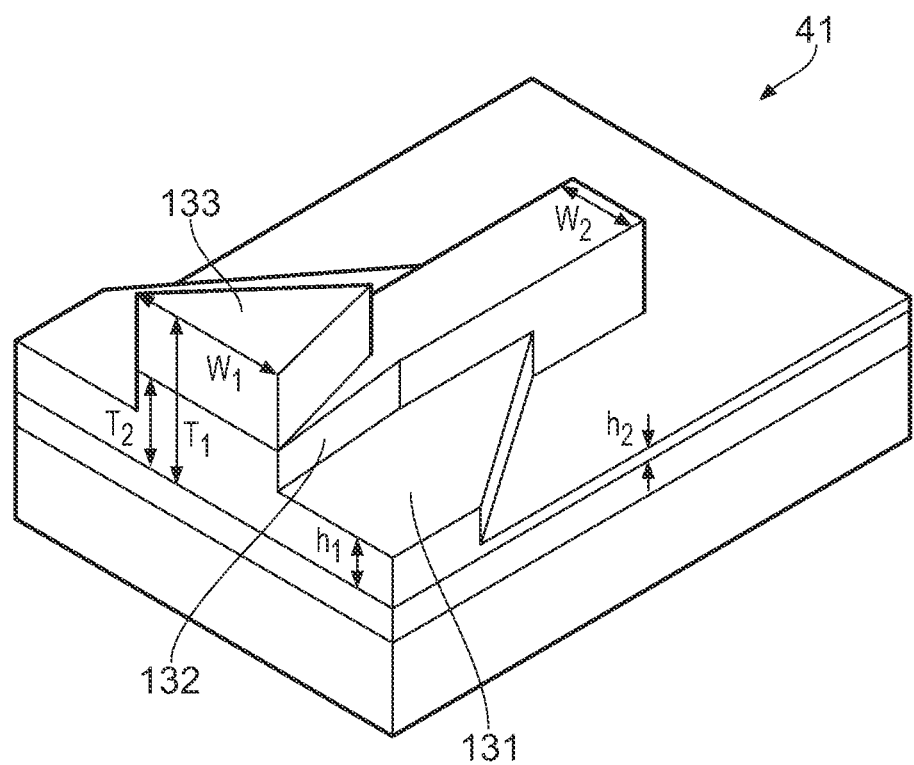
FIG. 4 shows a schematic of a transition region which forms part of the second embodiment.

FIG. 4 shows an example of a first or second transition region in the form of a taper. The taper couples a larger waveguide of a first height and width to a smaller waveguide of a second height and width so acts as both a "vertical taper" and a lateral taper. It comprises: a lower portion, 131 having a base "wedge-shaped" portion with laterally tapered sides that tapers the portion of the first slab region that is thicker than the second slab up to the second width (the width of the smaller waveguide); an intermediate portion, 132 which tapers a portion of the ridge above the first slab laterally from the larger waveguide width to the smaller waveguide width; and an upper "wedge" portion, 133 formed on top of the intermediate portion which tapers the portion of the ridge of the first height remaining above the second height to a point. The relative dimensions of the upper, intermediate and lower portions are chosen to maximise the coupling of light from the larger waveguide to the smaller waveguide in both a lateral and vertical direction relative to the waveguide platform.

The triple layer structure enables a transition to a different (thinner) slab thickness. The length of the transition region should be as short as possible to minimise the cavity length without introducing significant loss.

A third embodiment is described with reference to FIGS. 5 to 7, where like reference numerals correspond to those features described above in relation to FIGS. 1 to 4.

The third embodiment differs from the first embodiment in that the first Distributed Bragg Reflector is a Sectioned Grating-Distributed Bragg reflector (SG-DBR), 31 and the second Distributed Bragg Reflector is a Digital Supermode-Distributed Bragg Reflector (DS-DBR) 33 operating in transmission. In the embodiment shown in FIG. 5, the two DBRs are arranged in series and each DBR is a phase-tunable DBR so includes a phase tuning region, 8.

Figure 5:
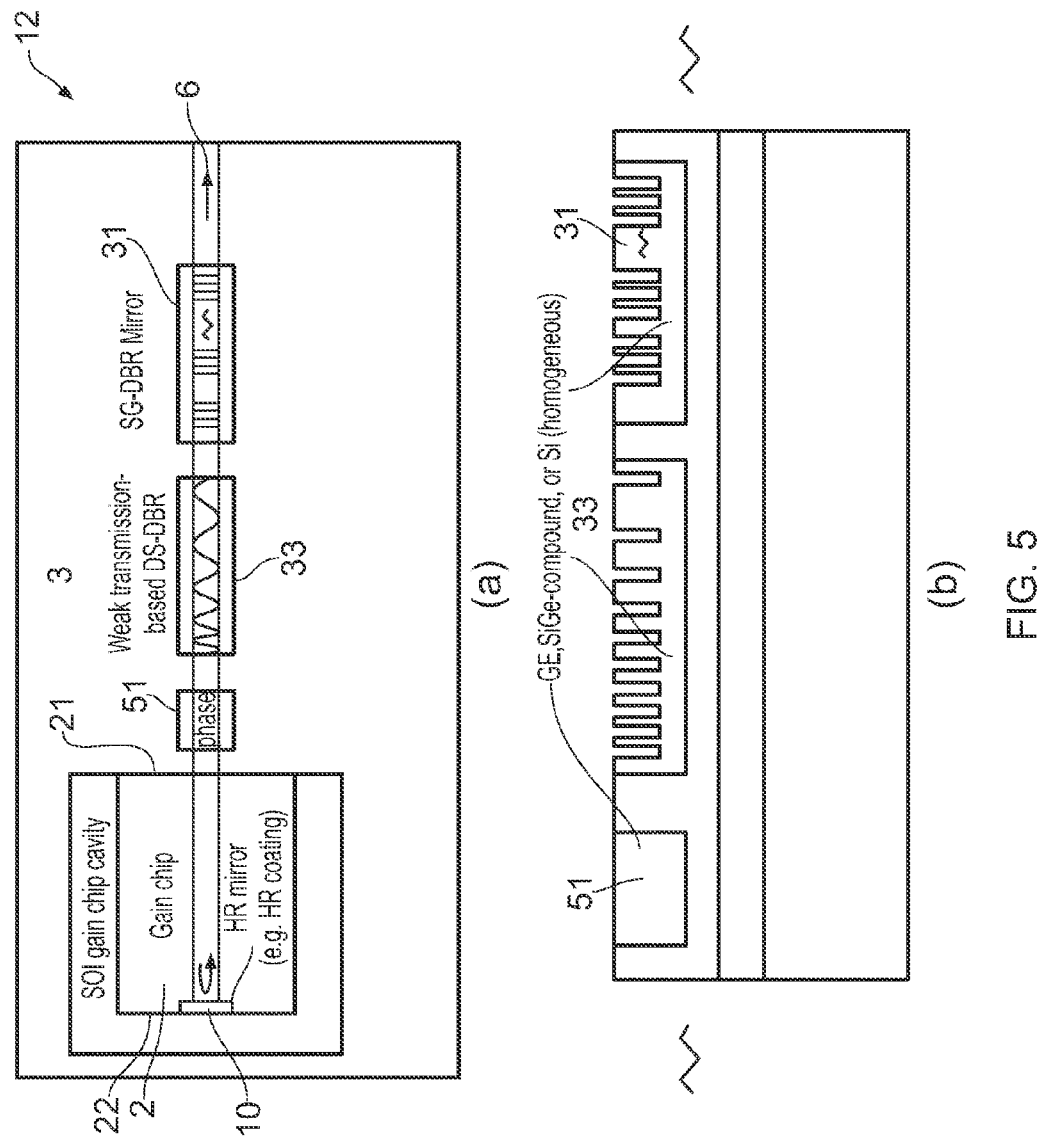
FIG. 5 shows a wavelength tunable silicon-on-insulator (SOI) laser according to a third embodiment of the present invention, where (a) is a top view schematic; (b) is a side view of the portion highlighted by the dotted box in (a); (c) is a top view of one example of the portion shown in (b) showing the detailed structure of a p-i-n phase-tunable region; (d) shows an alternative example of the highlighted portion also having a p-i-n tunable region; and (d) shows another alternative example of the highlighted portion, this time having a p-n tunable region (in this case, a $p^+$-p-n-$n^+$ structure)
Figure 5:
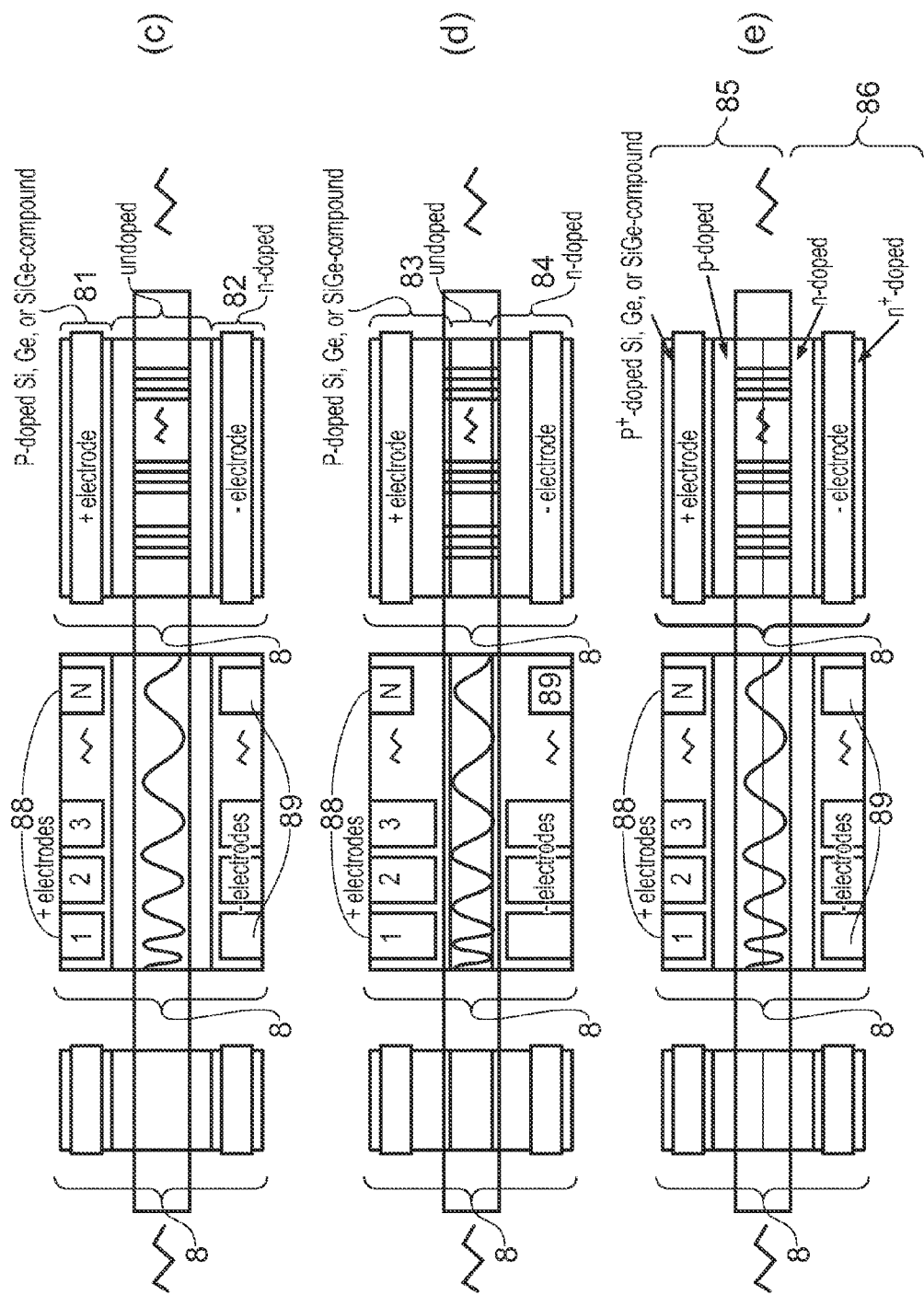

Referring specifically to the DS-DBR of the third embodiment, in FIGS. 5 (c) and (d), the phase tuning region is a p-i-n junction with positive electrodes, 88 located in the p-doped region and negative electrodes, 89 located in the n-doped region. In FIG. 5(c), the phase tuning region of the DS-DBR includes p- and n-doped regions which are detached from waveguide ridge defining an intrinsic region therebetween encompassing the entire waveguide ridge width which leads to a lower speed, but also a lower loss, and is compatible with forward bias carrier injection phase tuning. In FIG. 5(d) the p- and n-doped regions of the DS-DBR overlap the waveguide ridge using side-wall doping which leads to a higher speed, but higher loss and is compatible with reverse bias carrier depletion phase tuning.

In FIG. 1(e), the phase tuning region is a p-n junction, and can take the form of a p-n diode, or a $p^+$-p-n-$n^+$ diode, or even $p^{++}$-$p^+$-p-n-$n^+$-$n^{++}$ diode, having $p^{++}$, $p^+$, $n^+$, and $n^{++}$ regions outside the waveguide ridge and p and n regions overlapping the waveguide and joining at the middle. In this case there is no intrinsic region, enabling reverse bias operation and the use of the carrier depletion effect. This example therefore gives a higher speed but may also result in a higher power consumption. As shown in FIG. 5(b), the phase-tunable SG-DBRs, phase-tunable transmission DS-DBR (TDS-DBR) and the additional phase tuning regions, comprise a material such as Ge, SiGe or homogeneous Si. The gratings of the SG-DBR and DS-DBR are etched into this material.

Figure 6:
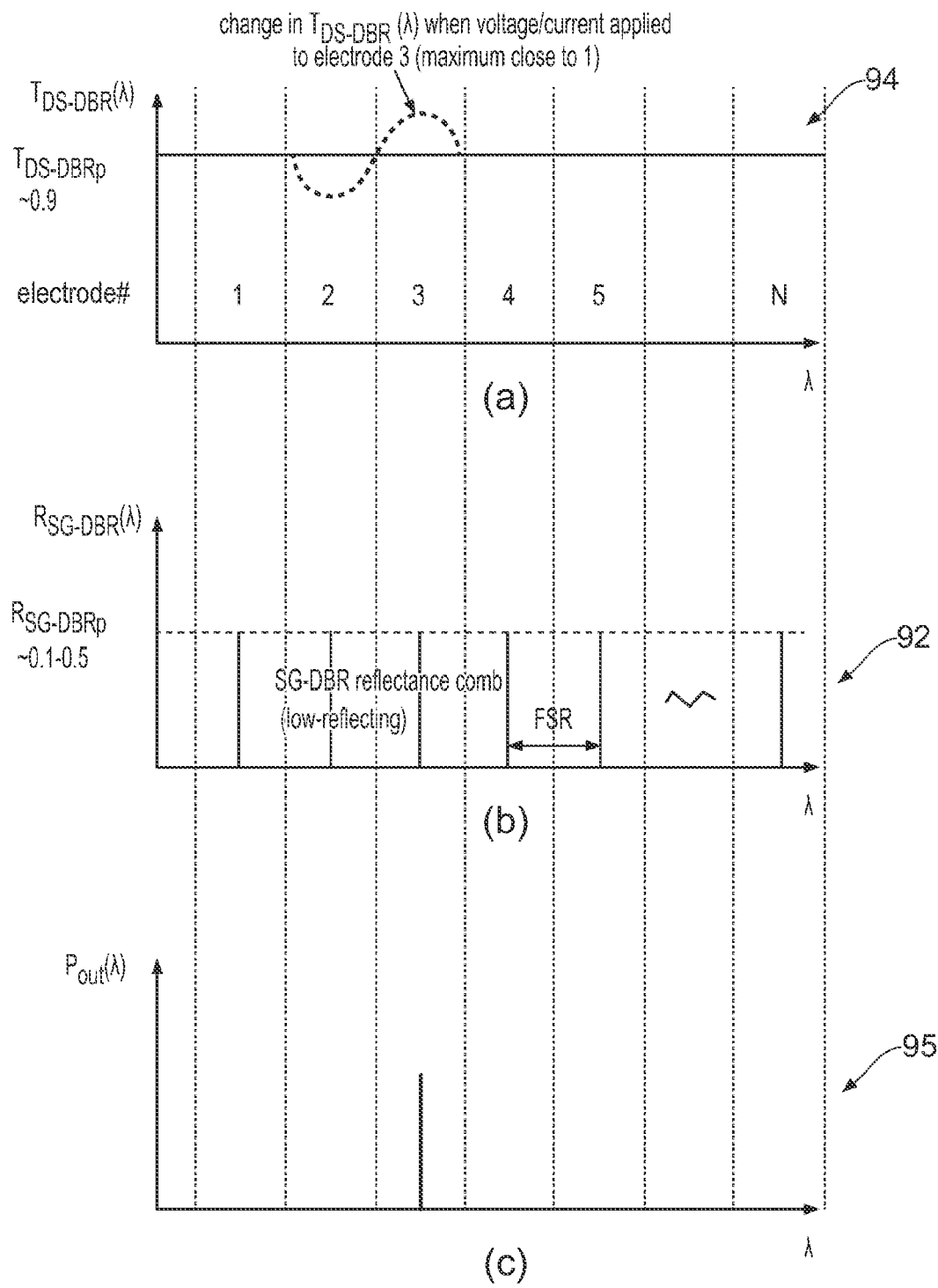
FIG. 6 shows a first example of a reflectance spectrum and transmittance spectrum of the DBR gratings and a laser output spectrum for any one of the examples shown in FIG. 5 before and after activation of the DS-DBR; where (a) shows the transmittance spectrum of the first DBR, solid line showing the spectrum before voltage/current activation, and dotted line showing the spectrum after voltage/current activation; (b) shows the comb spectrum of the second DBR; and (c) shows the resulting output spectrum of the laser.
Figure 7:
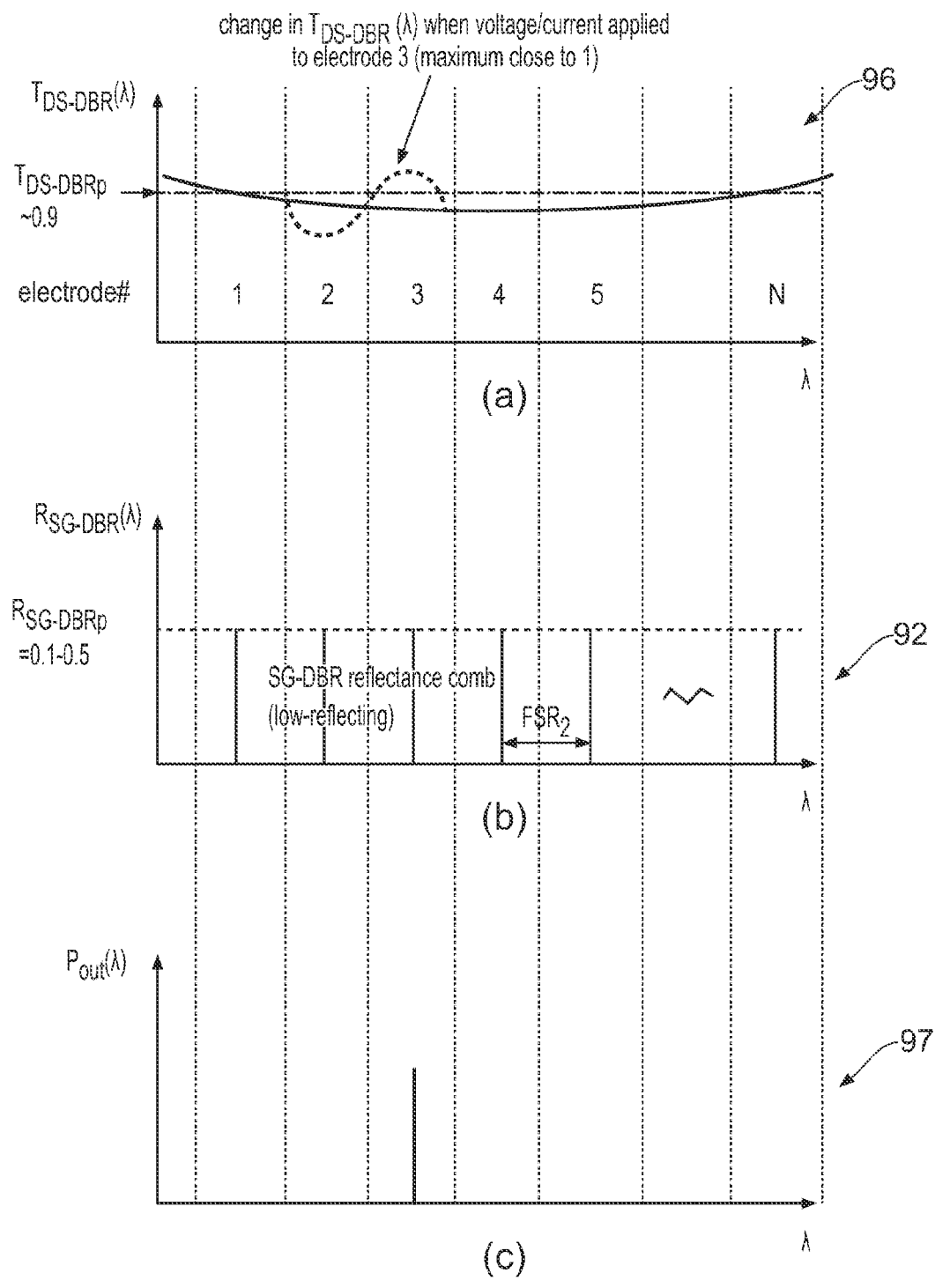
FIG. 7 shows a second example of a reflectance spectrum and transmittance spectrum of the DBR gratings and a laser output spectrum for any one of the examples shown in FIG. 5 before and after activation of the DS-DBR; where (a) shows the transmittance spectrum of the first DBR; (b) shows the comb spectrum of the second DBR; and (c) shows the resulting output spectrum of the laser.

As can be seen in FIGS. 5 and 6, the transmittance spectrum, 94 of the DS-DBR will change when a current/voltage is applied to one of the electrodes (in this case the third electrode). The transmittance spectrum before the application of a current/voltage is shown in bold in FIGS. 5(*a*) and 6(*a*), and the transmittance spectrum after the application of the current/voltage is shown in dotted lines in FIGS. 5(*a*) and 6(*a*). As before, the SG-DBR has a comb reflectance spectrum, 92 with a given FSR (shown in FIGS. 5(*b*) and 6(*b*).

The output spectrum of the laser corresponds to the sum of the transmitted spectrum of the (T)DS-DBR and the reflectance spectrum of the SG-DBR. For example, FIGS. 5(*c*) and 6(*c*) show the output spectrum, 95 of the laser when the third electrode is activated with an applied bias/current.

The SG-DBR acts as the laser output mirror (front mirror), and thus is made to be low reflecting with a reflectance preferably between 0.1 and 0.5. This is done by designing the grating to have a lower coupling coefficient (by for example reducing the etch depth of the grating corrugation), and/or by reducing the length of the grating.

The positive and negative electrodes are placed on the outermost doping regions of the p-i-n or p-n diode in all cases, so that they are sufficiently far away from the waveguide mode to avoid absorption losses, but otherwise spaced closely enough to each other to ensure high speed.

The example shown in FIG. 6 differs from that shown in FIG. 5 in that the TDS-DBR is configured to give rise to a curved transmittance response, 96 (with no current/voltage applied) which is the inverse of the curved power gain spectrum of the semiconductor medium.

In this way, without any current or voltage applied to any of the TDS-DBR gratings, the sum of the cavity round trip gain and losses is equal across the entire tuning wavelength range. This compensation, enables the TDS-DBR to be capable of selecting modes, 97 on the left and right edge regions of the tuning range. This curved response of the TDS-DBR can be hard-written into the grating response with a nonlinear chirped grating design, or, can be tuned in with a non-linear pattern of small bias currents/voltages applied to the electrodes.

Figure 8:
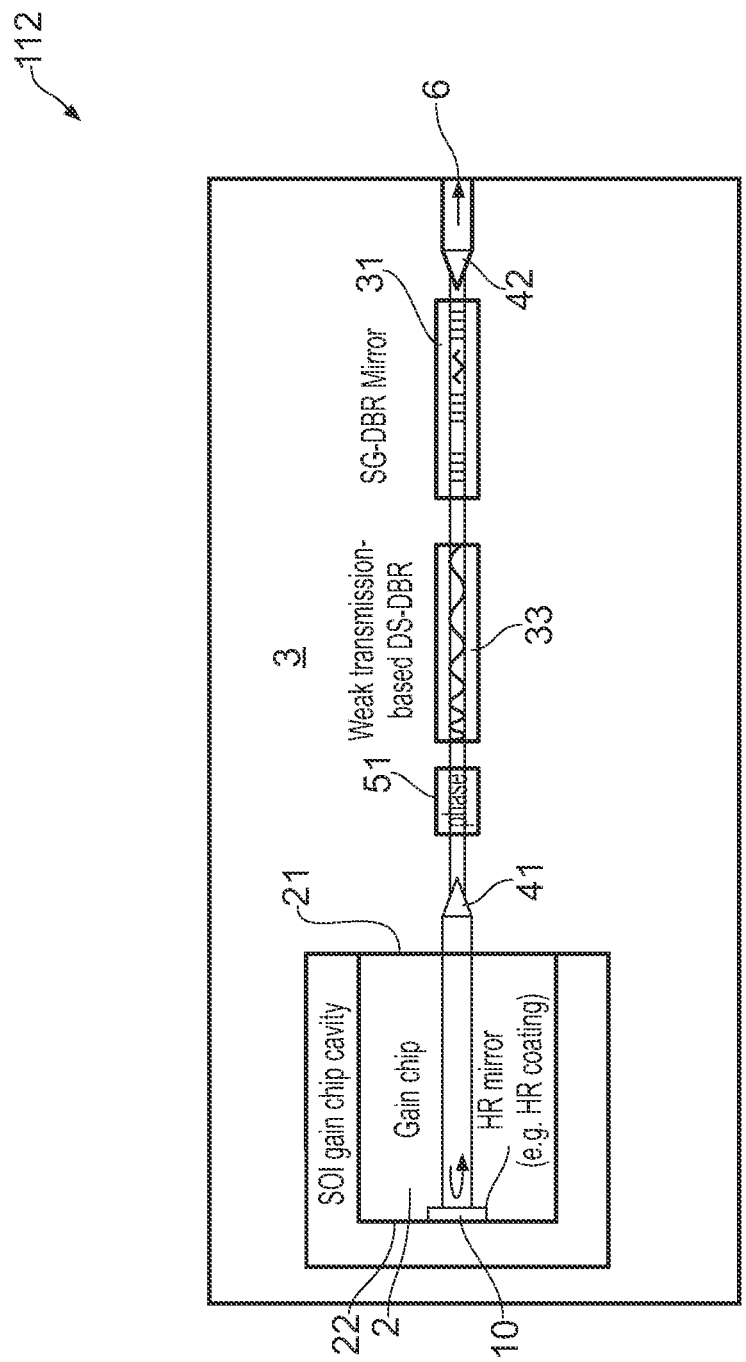
FIG. 8 shows a schematic of a wavelength tunable silicon-on-insulator (SOI) laser according to a fourth embodiment of the present invention.

A fourth embodiment is described with reference to FIG. 8, where like reference numerals correspond to those features described above in relation to FIGS. 5 and 4. The fourth embodiment differs from the third embodiment in that it includes a transition region (or mode transformer) located in-between the semiconductor gain medium and the DBRs (specifically in-between the gain medium and the additional phase tuning region).

As with the transition region described in relation to the second embodiment, the transition region of this embodiment is a transition from a waveguide of a first height, $T_1$ and first width, $w_1$ to a waveguide of a second height, $T_2$ and a second width $w_2$; the second height being less than the first height and the second width being less than the first width. In this case, the first and second Distributed Bragg Reflectors are located in a waveguide of a second height, $T_2$ and second width $w_2$.

An optional inverse transition region (or mode transformer) can be used after the SG-DBR mirror (i.e. outside the laser cavity) to expand the mode back to the original waveguide size. Alternatively the smaller waveguide dimensions can continue into the other regions of the SOI chip. This embodiment with reduced waveguide dimensions can produce phase modulators with faster tuning speeds and lower power consumption, at the expense of adding the additional optical loss introduced by the mode transformer to the laser cavity.

While the invention has been described in conjunction with the exemplary embodiments described above, many equivalent modifications and variations will be apparent to those skilled in the art when given this disclosure. Accordingly, the exemplary embodiments of the invention set forth above are considered to be illustrative and not limiting. Various changes to the described embodiments may be made without departing from the spirit and scope of the invention.

For example, any forward-biased p-i-n doping profile of any of the phase-tunable DBR or additional phase tuning region can be changed to a p-n, $p^+$-p-n-$n^+$ or $p^{++}$-$p^+$-p-n-$n^+$-$n^{++}$ doping structure, or similar variant of doping structure. In this way, carrier depletion and reverse bias voltages can be used to increase the modulation speed significantly beyond the 10 ns range down to 10 ps, but at the expense of lower power efficiency, and a more complex fabrication process due to the addition of extra doping steps and more mask layers.

In addition, in each of the embodiments described above, one or more of the DBRs could be replaced by a resonator such as a Multimode Interference (MMI) device configured to act as a Fabry-Perot filter; a ring resonator; or a waveguide Fabry-Perot filter.

Where a laser cavity includes a transition region, any additional phase tuning regions as described above may be located at regions of the first height/width or second height/width as the speed of operation of these is not critical. Thus, one or more of the additional phase tuning regions could be replaced by one or more thermal tuning regions. Additional phase tuning regions are beneficial in compensating for thermal laser drift.

Throughout this document, tuning via the "Vernier" effect should be understood to cover continuous wavelength tuning, discontinuous wavelength tuning and/or quasi continuous wavelength tuning. The Vernier effect arises where the transmittance or reflectance spectrum of a first resonator or reflector of the laser cavity has a peak-to-peak spacing which is different from the peak-to-peak spacing of the transmittance or reflectance spectrum of a second resonator or reflector of the laser cavity. For continuous tuning it is necessary for both the first and the second resonator/reflector to be phase tunable. Discontinuous tuning can be achieved via phase tuning of just one resonator/reflector. In this case, the output wavelength of the laser cavity will be limited to discrete values set by the remaining (non-tunable) resonator/reflector.

All references referred to above are hereby incorporated by reference.

The invention claimed is:

1. A wavelength tunable silicon-on-insulator (SOI) laser comprising:
    a laser cavity including:
        a semiconductor gain medium having a front end and a back end; and
        a phase-tunable waveguide platform coupled to the front end of the semiconductor gain medium;
        wherein the phase-tunable waveguide platform includes:
            a first Distributed Bragg Reflector (DBR);
            a first transition region on a first side of the first DBR;
            a second transition region on a second side of the first DBR; and
            a second Distributed Bragg Reflector (DBR);
        at least one of the Distributed Bragg Reflectors having a comb reflectance spectrum;
        wherein a highly reflective mirror is located at the back end of the semiconductor gain medium forming a mirror of the laser cavity such that the gain medium functions as a reflective semiconductor optical amplifier (RSOA);
        wherein at the first transition region a waveguide of a first height and a first width is coupled to a waveguide of a second height and a second width, the first height being different from the second height and/or the first width being different from the second width;

wherein at the second transition region a waveguide of the second height and the second width is coupled to a waveguide of a third height and a third width, the second height being different from the third height and/or the second width being different from the third width; and wherein the second transition region forms the output of the laser.

2. The wavelength tunable laser of claim 1, wherein the Distributed Bragg Reflector having a comb reflectance spectrum is a Sectioned Grating Distributed Bragg Reflector (SGDBR).

3. The wavelength tunable laser of claim 1, wherein at least one of the first Distributed Bragg Reflector and the second Distributed Bragg Reflector is a phase-tunable Distributed Bragg Reflector.

4. The wavelength tunable laser of claim 3, wherein the phase-tunable Distributed Bragg Reflector includes a phase tuning region which comprises an electro-optical medium.

5. The wavelength tunable laser of claim 3, wherein the phase-tunable Distributed Bragg Reflector comprises a phase tuning region which includes a p-i-n junction region.

6. The wavelength tunable laser of claim 3, wherein the phase-tunable Distributed Bragg Reflector comprises a phase tuning region which includes a p-n junction region.

7. The wavelength tunable laser of claim 1, wherein both of the first Distributed Bragg Reflector and the second Distributed Bragg Reflector are phase-tunable Distributed Bragg Reflectors.

8. The wavelength tunable laser of claim 7,
wherein the phase tuning region of the first Distributed Bragg Reflector includes any one of: a p-n junction; p-i-n junction; and
wherein the phase tuning region of the second Distributed Bragg Reflector includes any one of: a p-n junction, p-i-n junction.

9. The wavelength tunable laser of claim 1, wherein:
the first Distributed Bragg Reflector is a Sectioned Grating-Distributed Bragg reflector (SG-DBR); and
the second Distributed Bragg Reflector is a Sectioned Grating-Distributed Bragg reflector (SG-DBR).

10. The wavelength tunable laser of claim 1, wherein the phase-tunable waveguide platform includes bifurcated waveguides, each arm of the bifurcated waveguides comprising one Distributed Bragg Reflector.

11. The wavelength tunable laser of claim 10, wherein the phase-tunable waveguide platform includes an MMI coupler which couples light to the bifurcated waveguides.

12. The wavelength tunable laser of claim 1, wherein:
the first Distributed Bragg Reflector is a Sectioned Grating-Distributed Bragg reflector (SG-DBR); and
the second Distributed Bragg Reflector is a Digital Supermode-Distributed Bragg Reflector (DS-DBR).

13. The wavelength tunable laser of claim 1, further comprising at least one phase tuning region which is separate from the first and second Distributed Bragg Reflectors.

14. The wavelength tunable laser of claim 13, wherein one or more of said phase tuning region(s) comprise(s) an electro-optical medium.

15. The wavelength tunable laser of claim 13, wherein one or more of said phase tuning region(s) include(s): a p-n junction or a p-i-n junction.

16. The wavelength tunable laser of claim 1, wherein the waveguide platform comprises a waveguide portion having a silicon overlayer thickness (T) of more than or equal to 1 μm and less than or equal to 4 μm.

17. The wavelength tunable laser of claim 16, wherein the waveguide platform comprises a waveguide portion having a silicon overlayer thickness (T) of more than or equal to 2.5 μm and less than or equal to 3.2 μm.

18. The wavelength tunable laser of claim 1, wherein the semiconductor gain medium is a gain chip.

19. The wavelength tunable laser of claim 1, wherein said mirror located at the back end of the semiconductor gain medium is a reflective back-facet of the semiconductor gain medium.

20. The wavelength tunable laser of claim 1, wherein the second height is less than the first height.

21. The wavelength tunable laser of claim 1, wherein the first and second Distributed Bragg Reflectors are located in a waveguide of the second height.

22. The wavelength tunable laser of claim 1, wherein the second width is less than the first width.

23. The wavelength tunable laser of claim 22, wherein the first and second Distributed Bragg Reflectors are located in a waveguide of said second width.

24. The wavelength tunable laser of claim 1, wherein the first transition region includes a taper.

25. The wavelength tunable laser of claim 1, wherein the first transition region is a mode transformer.

26. The wavelength tunable laser of claim 1, wherein the mirror of the laser cavity which is located at the back end of the semiconductor gain medium has a reflectivity of at least 85%.

27. The wavelength tunable laser of claim 1, wherein the mirror of the laser cavity which is located at the back end of the semiconductor gain medium has a reflectivity of at least 90%.

28. A wavelength tunable silicon-on-insulator (SOI) laser comprising:
a laser cavity including:
a semiconductor gain medium having a front end and a back end; and
a phase-tunable waveguide platform coupled to the front end of the semiconductor gain medium;
wherein the phase-tunable waveguide platform includes:
a first Distributed Bragg Reflector (DBR);
a first transition region on a first side of the first DBR;
a second transition region on a second side of the first DBR; and
a second Distributed Bragg Reflector (DBR);
at least one of the Distributed Bragg Reflectors having a comb reflectance spectrum;
wherein at the first transition region a waveguide of a first height and a first width is coupled to a waveguide of a second height and a second width, the first height being different from the second height and/or the first width being different from the second width;
wherein at the second transition region a waveguide of a third height and a third width is coupled to a waveguide of a fourth height and a fourth width, the third height being different from the fourth height and/or the third width being different from the fourth width; and
wherein a mirror having a reflectivity of at least 85% is located at the back end of the semiconductor gain medium to form a mirror of the laser cavity such that the gain medium functions as a reflective semiconductor optical amplifier (RSOA).

29. A wavelength tunable silicon-on-insulator (SOI) laser comprising:
a laser cavity including:
a semiconductor gain medium having a front end and a back end; and
a phase-tunable waveguide platform coupled to the front end of the semiconductor gain medium;
wherein the phase-tunable waveguide platform includes a first Distributed Bragg Reflector (DBR) and a second Distributed Bragg Reflector (DBR); at least one of the Distributed Bragg Reflectors having a comb reflectance spectrum;
wherein a highly reflective mirror is located at the back end of the semiconductor gain medium forming a mirror of the laser cavity such that the gain medium functions as a reflective semiconductor optical amplifier (RSOA);
wherein one of the first DBR and the second DBR forms the output of the laser;
wherein the first DBR is located in a waveguide having a ridge and comprising a p-i-n junction; and
wherein a p-doped region of the junction and an n-doped region of the junction overlap respective side walls of the waveguide ridge and an intrinsic region of the junction occupies only a central portion of the waveguide ridge.

* * * * *